(12) United States Patent
Senatori

(10) Patent No.: US 8,002,561 B1
(45) Date of Patent: Aug. 23, 2011

(54) CONNECTION SYSTEMS AND METHODS

(75) Inventor: Mark David Senatori, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/713,048

(22) Filed: Feb. 25, 2010

(51) Int. Cl.
   *H01R 13/44* (2006.01)
(52) U.S. Cl. ............................................... 439/136
(58) Field of Classification Search .......... 439/136, 439/135, 942, 955, 76.1, 374, 347
   See application file for complete search history.

(56) References Cited

U.S. PATENT DOCUMENTS

| 5,401,183 | A |   | 3/1995 | Tan et al. |
| 5,749,854 | A | * | 5/1998 | Shen ............................ 604/131 |
| 5,769,646 | A |   | 6/1998 | Cavello et al. |
| 6,058,654 | A | * | 5/2000 | Rissone ........................ 49/314 |
| 6,059,583 | A | * | 5/2000 | Croft et al. .................... 439/131 |
| 2001/0024907 | A1 |   | 9/2001 | Murakami et al. |

FOREIGN PATENT DOCUMENTS

| CN | 201219149 Y | 4/2009 |
| ES | 2226565 A1 | 3/2005 |

OTHER PUBLICATIONS

IXBT LABS, Panasonic Toughbook CF-30 Fully-Rugged Notebook; http://ixbtlabs.com/articles3/portopc/panasonic-cf30.html, downloaded Apr. 7, 2011.

* cited by examiner

*Primary Examiner* — Jean F Duverne

(57) ABSTRACT

A connector apparatus is provided. The apparatus can include a housing having at least a first aperture and a second aperture. The apparatus can further include a hollow, flexible member having a first end and a second end. The first end of the hollow, flexible, member can be non-detachably attached to the first aperture. The second end of the hollow, flexible, member can be detachably attached to the second aperture. The apparatus can also include a tensioning member disposed to bias the hollow, flexible, member towards the housing.

13 Claims, 6 Drawing Sheets

CONNECTION SYSTEMS AND METHODS

BACKGROUND

Portable electronic devices play an increasingly important role in everyday life. Consumer expectations have increased to the point that portable electronic devices are routinely subjected to conditions that would have previously been the death-knell for electronic devices. For example, consumers now expect that routine exposure of the electronic device to water and dust not impact the functionality of the device. For electronic devices having a multitude of input and output ports, exposure to water or dust can be potentially catastrophic, resulting in failure of the port, or worse yet, failure of the entire device.

BRIEF DESCRIPTION OF THE DRAWINGS

Advantages of one or more disclosed embodiments may become apparent upon reading the following detailed description and upon reference to the drawings in which.

DETAILED DESCRIPTION

Electronic devices frequently fail when exposed to dusty or moist environments. With the growing number of portable electronic devices, users will frequently carry such devices outdoors where exposure to dust and moisture is all but inevitable. Input and output ports ("I/O ports") are included on many portable electronic devices to enable the attachment of peripheral electronic components to the device, for example a Universal Serial Bus ("USB") port is often included to support the attachment of numerous peripheral devices. The ability to prevent the incursion of dust and moisture through an I/O port into the electronic device is essential to minimize the likelihood of premature failure of the device when the user purposely or unwittingly exposes the device to such conditions.

A connector apparatus is provided. The apparatus can include a housing having at least a first aperture and a second aperture. The apparatus can further include a hollow, flexible member having a first end and a second end. The first end of the hollow, flexible, member can be non-detachably attached to the first aperture. The second end of the hollow, flexible, member can be detachably attached to the second aperture. The apparatus can also include a tensioning member disposed to bias the hollow, flexible, member towards the housing.

A connection method is also provided. The method can include non-detachably attaching a first end of a hollow, flexible member to a first aperture disposed within a housing. The method can also include detachably attaching a second end of the hollow, flexible member to a second aperture disposed within the housing. The method can further include routing at least a portion the hollow, flexible member in a channel disposed at least partially on a surface of the housing. The method can additionally include biasing the hollow, flexible member at least partially within the channel using a tensioning member.

A connector system is also provided. The system can include an electronic device at least partially disposed within a housing having a first aperture and a second aperture. The system can further include a hollow, flexible member including a first end and a second end routed across at least one surface forming the housing. The first end of the hollow, flexible, member can be non-detachably attached to at least a portion of the first aperture. The second end of the hollow, flexible, member can be detachably attached to at least a portion of the second aperture. The system can also include a tensioning member disposed to bias the hollow, flexible member towards the housing.

Figure 1:
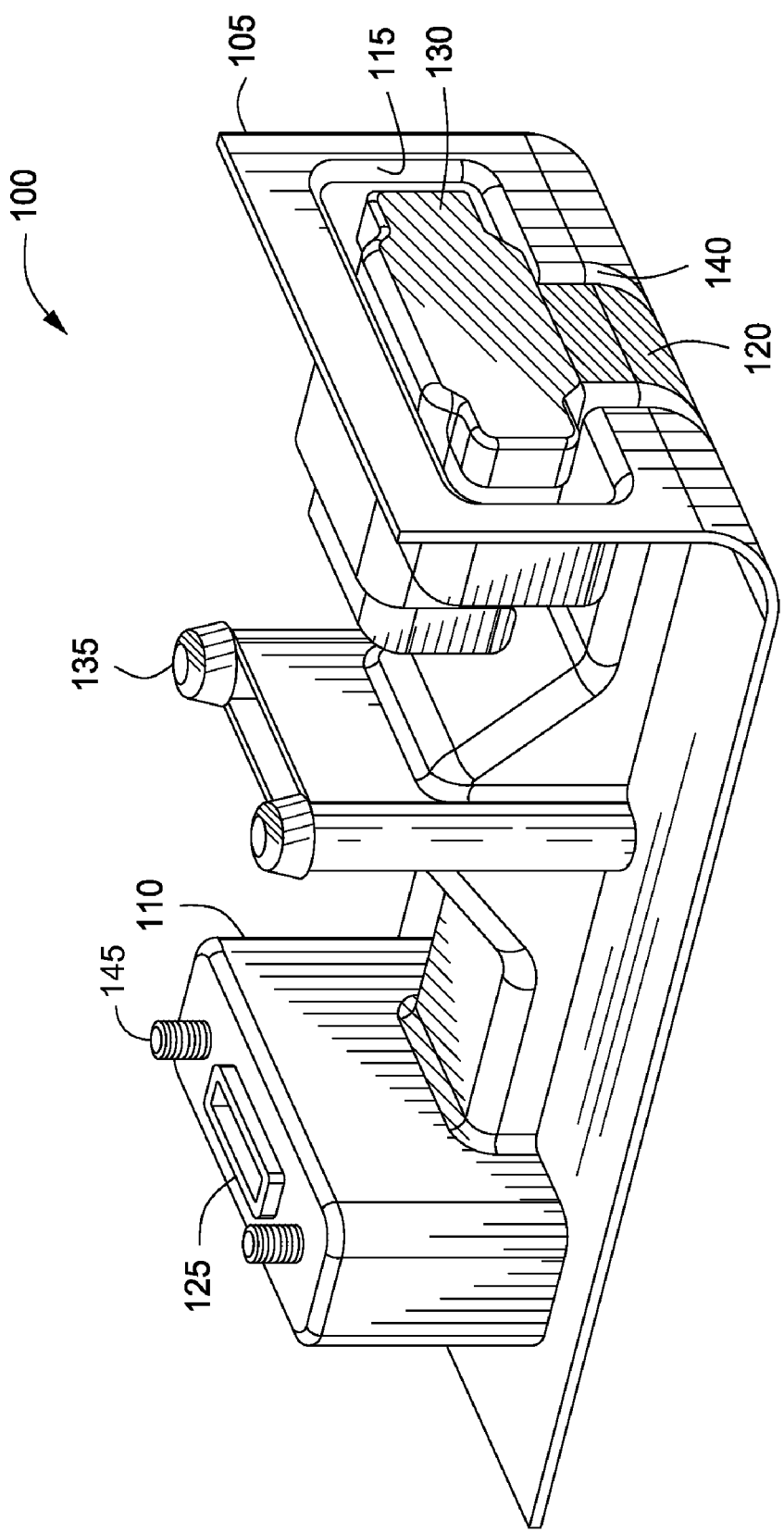
FIG. 1 is an upper perspective view depicting one example of a connector apparatus, according to one or more embodiments described herein.
Figure 1A:
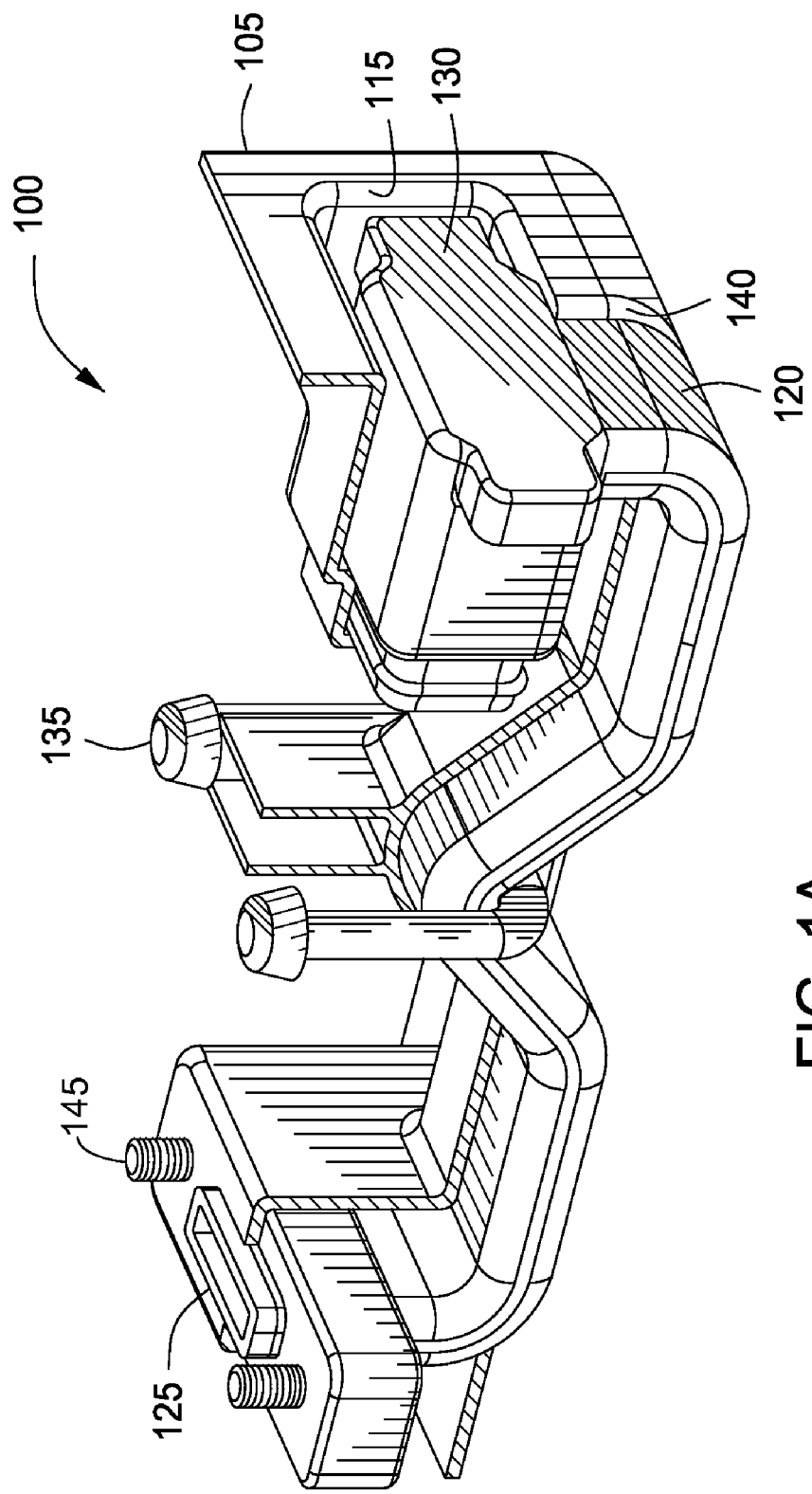
FIG. 1A is a partial sectional view depicting one example of the connector apparatus depicted in FIG. 1, according to one or more embodiments described herein.

For clarity and ease of discussion, FIGS. 1 and 1A will be discussed in detail as a group. FIG. 1 is an upper perspective view depicting one example of a connector apparatus 100, according to one or more embodiments. FIG. 1A is a partial sectional view depicting one example of the connector apparatus 100 as depicted in FIG. 1, according to one or more embodiments. In at least some embodiments, the connector apparatus 100 can include a housing 105 having at least a first aperture 110 and a second aperture 115 disposed thereupon. A hollow, flexible, member 120 having a first end 125 and a second end 130 can be disposed between the first aperture 110 and the second aperture 115, thereby providing an enclosed pathway or conduit linking the two apertures 110, 115. A tensioning member 135 can be used to bias the hollow, flexible, member 120 towards the housing 105. In at least some embodiments, the hollow, flexible, member 120 can be routed at least partially within a channel 140 disposed on the surface of the housing 105, for example on an exterior surface of the housing 105 as depicted in FIGS. 1 and 1A.

The housing 105 can include any housing suitable for the partial or complete disposal of an electronic device therein. Illustrative, non-limiting, examples of housings 105 can include portable computing device cases, cellular communication device cases, portable media player cases, and the like. The housing 105 can be a metallic or non-metallic housing. The first aperture 110 and the second aperture 115 can be disposed at any location on the housing 105 with respect to each other, for example the first aperture 110 can be disposed on the "bottom" of the housing 105, while the second aperture 115 can be disposed on the "side" of the housing 105.

The terms "top," "bottom," "side," and other like or similar terms used herein refer to relative positions to another and are not intended, nor should be interpreted, to denote a particular absolute direction or spatial orientation. For example, a feature described as being on the "bottom" surface of a device could be on the "top" surface or a "side" surface of the device if the device is rotated or inverted; such rotation or inversion is envisioned to be fully incorporated within the scope of one or more claimed embodiments disclosed or otherwise described herein.

The first end 125 and the second end 130 can provide the terminal points for the hollow, flexible, member 120. The hollow, flexible, member 120 can have any shape, geometry, or length suitable for connecting the first aperture 110 with the second aperture 115. In at least some embodiments, the hollow, flexible, member 120 can include any suitably flexible, pliable, or deformable material, for example natural or man-made rubbers, flexible polymer or copolymers, elastomeric compounds, or similar flexible materials. In at least some embodiments, the hollow, flexible, member 120 can connect all or a portion of an interior space within the housing 105 to an exterior space surrounding the housing.

The hollow, flexible, member 120 can be biased towards the surface of the housing 105 by one or more tensioning members 135. In at least some embodiments, the tensioning member 135 can be anchored to the housing 105. In at least some embodiments, the tensioning member 135 can be disposed at least partially about the exterior periphery of the hollow, flexible, member 120 as depicted in FIGS. 1 and 1A. In at least some embodiments, the tensioning member 135 can bias any slack within the hollow, flexible, member 120 towards the housing 105, and in some embodiments, at least a portion of the flexible member 120 biased towards the housing 105 can partially or completely retract into a recess formed within the surface of the housing. In at least some embodiments, the hollow, flexible, member 120 can be distorted, for example by squeezing, to permit the passage of one or more objects, for example one or more conductors, through the flexible member 120. In at least some embodiments, all or a portion of the flexible member 120, the first end 110 and the second end 115 can be partially or completely disposed within a channel 140 on a surface of the housing 105, for example a channel on an external surface of the housing 105 as depicted in FIGS. 1 and 1A.

In at least some embodiments, a rigid flange can be at least partially embedded within the first end 125 of the flexible member 120. In one or more embodiments, one or more fasteners 145, for example one or more threaded fasteners, can be attached to the flange to permit the operable connection of the first end 125 to the housing 105. In at least some embodiments, a gasket or other compressible member can be disposed about the first end 125 to permit the formation of a water-proof and dust-tight seal between the first end 125 and the housing 105.

As used herein, an "operable connection", or a connection by which entities are "operably connected", is one in which the entities are connected in a manner whereby the one entity is in some way attached or otherwise attached to a second entity. An operable connection can be directly between the first and the second entities, for example through the use of threaded fasteners, nails, chemical adhesives, weldment, or the like. A direct connection between the first and the second entities can be non-detachable, for example through the use of chemical adhesives or weldment, or detachable, for example through the use of removable fasteners such as threaded fasteners or cam-lock connectors. An operable connection can be indirectly between the first and the second entities via one or more intermediate entities, for example a piston can be operatively connected to a crankshaft via a connecting rod, an intermediate entity.

In at least some embodiments, the tensioning member 135 can include any number of systems, devices, or any combination of systems and devices suitable for maintaining sufficient tension on the flexible member 120 to maintain the flexible member proximate the housing 105 at all times. In at least some embodiments, the tensioning member can include an elastomeric band extending about at least a portion of the perimeter of the flexible member 120, and detachably or non-detachably anchored at both ends to the housing 105.

Figure 2:
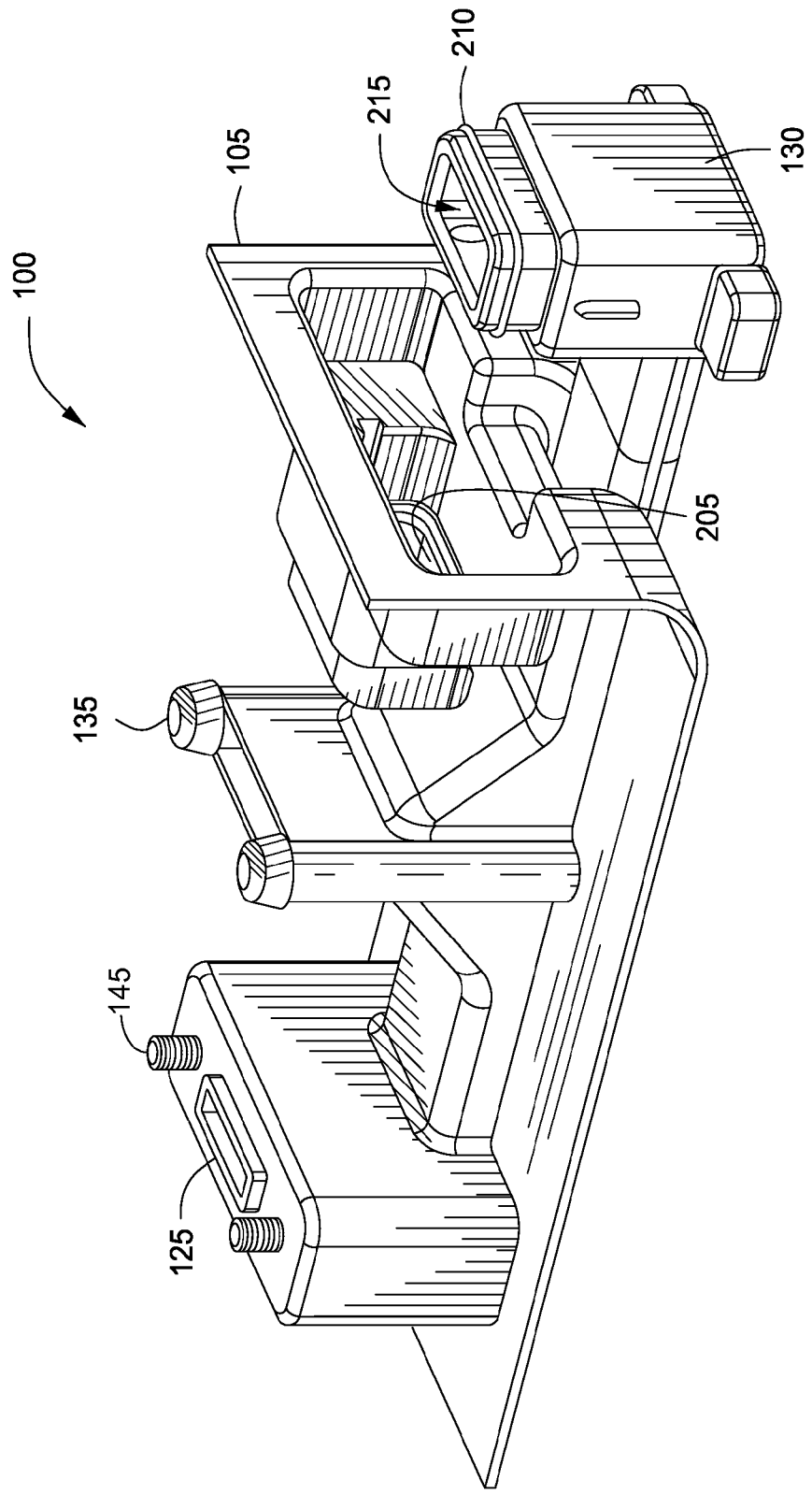
FIG. 2 is an upper perspective view depicting one example of the connector apparatus depicted in FIG. 1, according to one or more embodiments described herein.
Figure 2A:
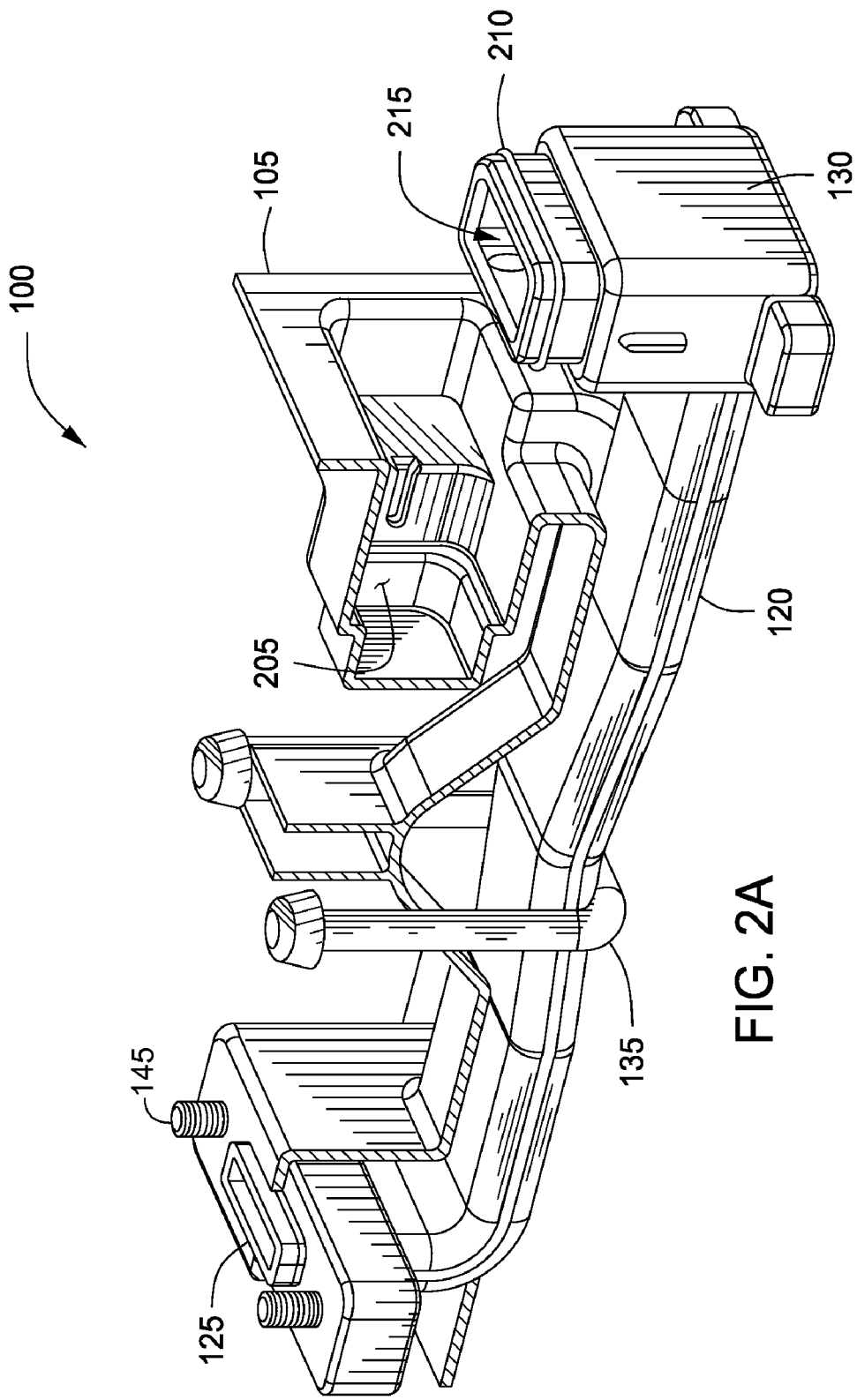
FIG. 2A is a partial sectional view depicting one example of the connector apparatus depicted in FIG. 2, according to one or more embodiments described herein.

FIG. 2 is an upper perspective view depicting one example of the connector apparatus 100 depicted in FIG. 1, according to one or more embodiments. FIG. 2A is a partial sectional view depicting one example of the connector apparatus 100 depicted in FIG. 2, according to one or more embodiments. In FIGS. 2 and 2A, the second end 130 of the flexible member 120 is depicted detached from the second aperture 115, exposing a mating surface 205 within the second aperture 115 and a gasket 210 about the second end 130. In at least some embodiments, at least one interface 215, for example an electronic device interface, can be disposed in whole or in part within the second end 130. The tensioning member 135 can be displaced when the second end 130 is detached from the second aperture 115, to provide a suitable extension, slack, or "play" in the hollow, flexible, member 120 to permit the attachment of a device (not shown in FIGS. 2 and 2A) to the at least one interface 215.

In at least some embodiments, a mating surface 205 can be disposed in whole or in part about the interior of the second aperture 115 on the housing 105. In at least some embodiments, at least one gasket 210 can be disposed about all or a portion of the second end 130 of the hollow, flexible, member 120. In at least some embodiments, at least one interface 215 can be disposed within the second end 130 of the flexible member 120. In at least some embodiments, all or a portion of the gasket 210 can be disposed proximate at least a portion of the mating surface 205 when the second end 130 of the flexible member 120 is detachably attached, inserted or otherwise disposed within the second aperture 115, forming a water-proof and dust-tight seal between the second end 130 and the housing 105.

In some embodiments, a plurality of conductors (not shown in FIGS. 2 and 2A) can be disposed within the hollow, flexible, member 120. In at least some embodiments, at least a portion of the plurality of conductors can communicatively couple one or more components disposed at least partially within the housing 105 with the at least one interface 215 disposed at least partially within the second end 130 of the hollow, flexible, member 120. For example, in one embodiment a plurality of conductors can be disposed within the hollow, flexible, member 120, and at least a portion of the conductors can communicatively couple an input/output ("I/O") controller with a Universal Serial Bus ("USB") interface 215 disposed within the second end 120 of the flexible member 120. While a USB interface is used as an illustrative example, other interfaces can be similarly employed, for example an IEEE 1394 ("Firewire") interface; a High Definition Multimedia Interface ("HDMI"); a Digital Video Interface ("DVI"); a Video Graphics Array ("VGA") interface; an Ethernet interface; an External Serial Advanced Technology Attachment ("eSATA") interface; or any similar multi-conductor interface 215 can be used.

As used herein, the term "communicative coupling", or a connection by which entities are "communicatively coupled", is one by which electromagnetic signals, physical communications, and/or logical communications may be sent and/or received. Typically, a communicative coupling includes a physical interface, an electrical interface, and/or a data interface, but it is to be noted that an communicative coupling may include differing combinations of these or other types of connections sufficient to allow intermittent or continuous communication or control. For example, two entities can be communicatively coupled by being able to communicate signals to each other directly or through one or more intermediate entities like a processor, operating system, a logic device, software, or other entity. Logical and/or physical communication channels can be used to create a communicative coupling.

The mating surface 205 disposed within the second aperture 115 can have any size, shape, orientation, or geometry suitable for establishing a water-proof and dust-tight seal with the gasket 210 disposed about the second end 130 of the hollow, flexible, member 120. Without limitation, the mating surface 205 can include a planar mating surface, a chamfered mating surface, a notched mating surface, or a grooved mating surface, an illustrative planar mating surface disposed within the second aperture 115 is depicted in FIGS. 2 and 2A. The mating surface 205 can be any material capable of providing a water-proof and dust-tight seal when disposed proximate the gasket 210. The mating surface 205 can be a rigid, flexible, or semi-rigid surface.

The gasket 210 can be disposed in whole or in part about the second end 130 of the hollow, flexible, member 120. The gasket 210 can include any number of systems, devices, or any combination of systems and devices suitable for providing a water-proof and dust-tight seal when disposed proximate the mating surface 205. In at least some embodiments, the gasket 210 can include one or more elastomeric sealing devices, for example one or more "O-rings" or the like as illustrated in the example embodiment depicted in FIGS. 2 and 2A.

Figure 3:
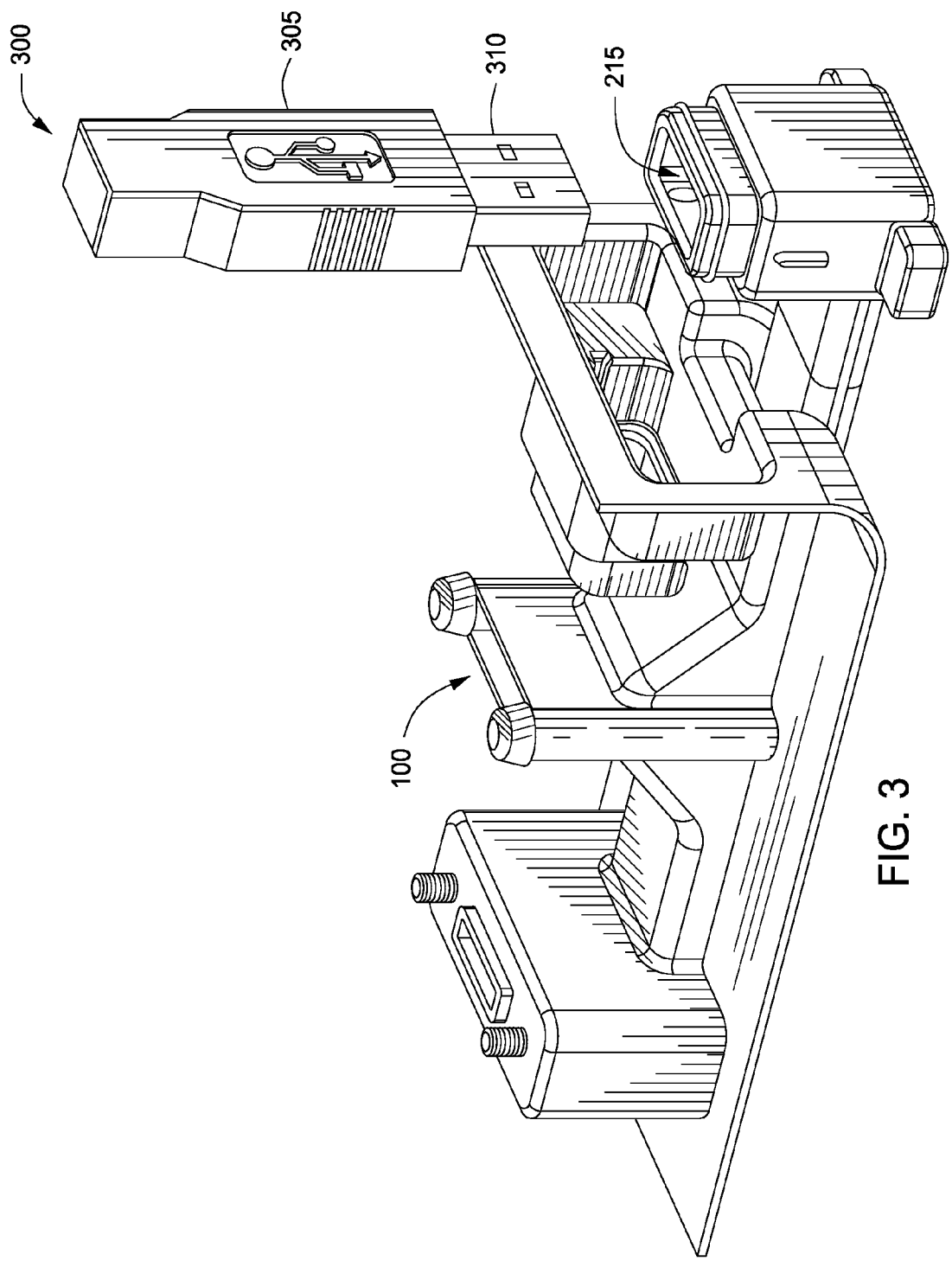
FIG. 3 is an upper perspective view depicting one example of a connector system, according to one or more embodiments described herein.

FIG. 3 is an upper perspective view depicting one example of a connector system 300, according to one or more embodiments. As depicted in FIG. 3, a device 305, for example a USB storage device, can have an interface 310 complementary to the interface 215 disposed within the second end 130 of the hollow, flexible, member 120. Although a USB device 305 is depicted in FIG. 3, a device having any interface 310 can be similarly used, provided a complementary interface 215 is provided on the second end 130 of the hollow, flexible, member 120. While the device 305 is illustratively depicted as a wireless device in FIG. 3, the device 305 can include any wired device having an interface 310, for example a display unit having a VGA, HDMI, or DVI interface disposed on the end of a cable.

Figure 4:
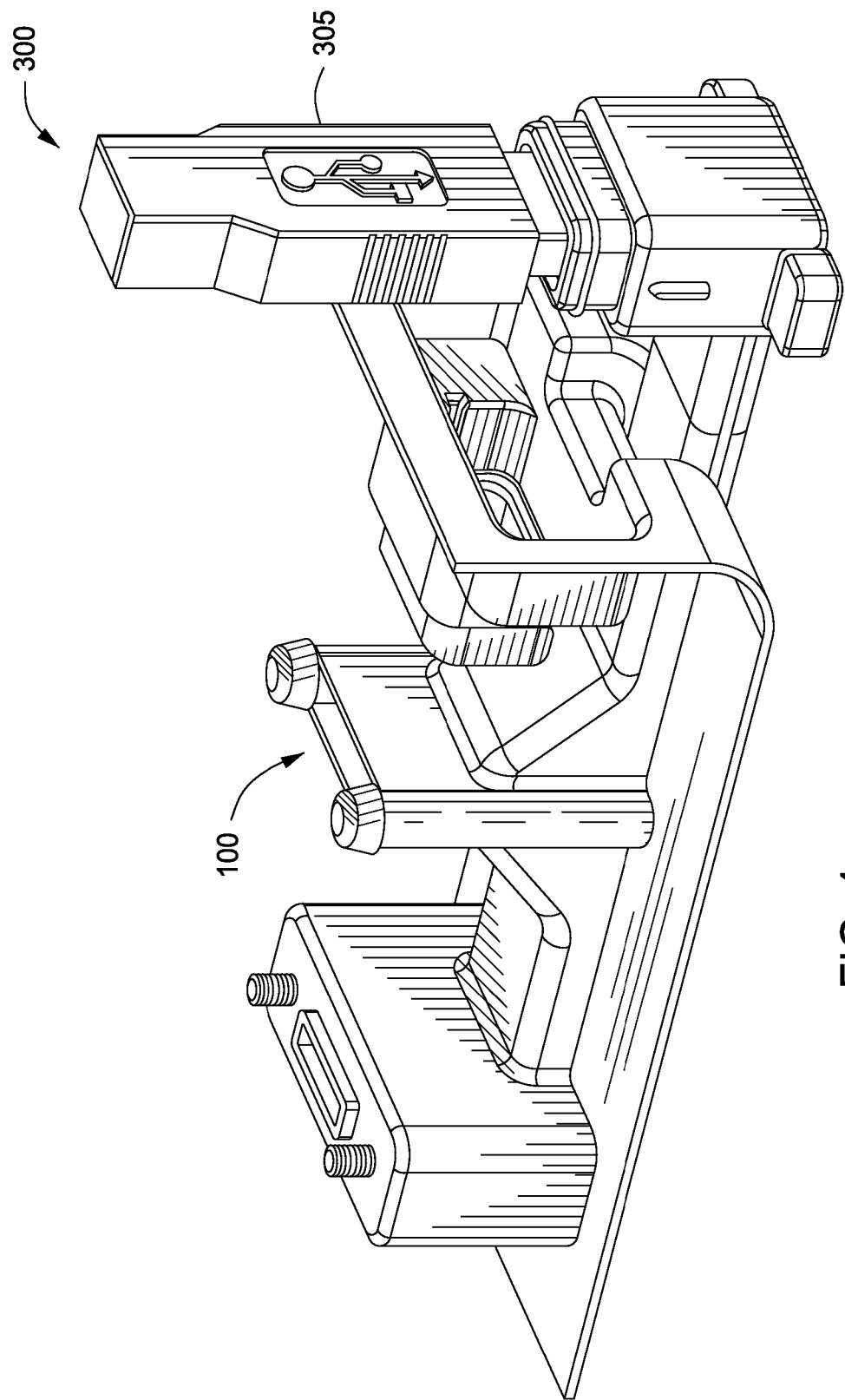
FIG. 4 is an upper perspective view depicting another example of the connector system depicted in FIG. 3, according to one or more embodiments described herein.

FIG. 4 is an upper perspective view depicting another example of the connector system 300 depicted in FIG. 3, according to one or more embodiments. As depicted in FIG. 4, the device interface 310 can be communicatively coupled to the at least one interface 215 disposed within the second end 130 of the hollow, flexible, member 120. In at least some embodiments, the communicative coupling of the device 305 to the at least one interface 215 can permit an electronic device disposed at least partially within the housing 105 to access one or more features or capabilities of the device 305. For example, communicative coupling a wireless USB dongle device 305 to the at least one interface 215 can permit an electronic device disposed within the housing 105 to access one or more wireless I/O devices such as a wireless keyboard or mouse.

While the foregoing is directed to embodiments of the present invention, other and further embodiments of the invention may be devised without departing from the basic scope thereof, and the scope thereof is determined by the claims that follow.

What is claimed is:

1. A connector apparatus comprising:
a housing having at least a first aperture and a second aperture;
a hollow, flexible member having a first end and a second end;
wherein the first end is non-detachably attached to the first aperture; and
wherein the second end is detachably attached to the second aperture;
a tensioning member disposed to bias the hollow, flexible member towards the housing
a plurality of conductors disposed within the hollow member; and
at least one interface disposed at least partially within the second end, the at least one interface communicatively coupled at least a portion of the plurality of conductors.

2. The apparatus of claim 1, further comprising a channel disposed at least partially on a surface of the housing, the channel connecting the first aperture and the second aperture.

3. The apparatus of claim 2, wherein the hollow, flexible member is disposed at least partially within the channel.

4. The apparatus of claim 3, wherein the tensioning member biases at least a portion of the hollow, flexible member at least partially within the channel.

5. The apparatus of claim 1, wherein the first end is non-detachably attached using fastener disposed about the first aperture.

6. The apparatus of claim 1, further comprising at least one fastener disposed on the first end of the hollow flexible member, the at least one fastener adapted to provide, when attached to the housing, a water-proof and dust-tight seal between the first end and the housing.

7. The apparatus of claim 1, wherein the housing comprises an enclosure disposed at least partially about a computing device comprising a processor and at least one input/output controller.

8. The apparatus of claim 1, wherein the at least one interface is selected from the group of interfaces consisting of: a Universal Serial Bus ("USB") interface; an IEEE 1394 ("Firewire") interface; a High Definition Multimedia Interface ("HDMI"); a Digital Video Interface ("DVI"); a Video Graphics Array ("VGA") interface; an Ethernet interface; and an External Serial Advanced Technology Attachment ("eSATA") interface.

9. The apparatus of claim 1, wherein a mating surface is disposed at least partially within the second aperture, and wherein a gasket is disposed at least partially about the second end of the hollow, flexible member; the mating surface and gasket adapted to provide a water-proof and dust-tight seal when the second end is detachably attached to the second aperture.

10. A connection system, comprising:
an electronic device at least partially disposed within a housing; the housing comprising a first aperture and a second aperture;
a hollow, flexible member comprising a first end and a second end routed across at least one surface forming the housing;
wherein the first end is non-detachably attached to at least a portion of the first aperture; and
wherein the second end is detachably attached to at least a portion of the second aperture;
a tensioning member disposed to bias the hollow, flexible member towards the housing
a plurality of conductors disposed within the hollow, flexible member; and
at least one interface disposed at least partially within the second end of the hollow, flexible member, wherein at least a portion of the plurality of conductors are communicatively coupled to at least a portion of the interface.

11. The system of claim 10, further comprising:
a mating surface disposed at least partially within the second aperture; and
a gasket disposed at least partially about the second end of the hollow, flexible member;

wherein the mating surface and the gasket are adapted to provide a water-proof and dust-light seal when the second end is detachably attached to the second aperture.

12. The system of claim 10, further comprising a device having a complementary interface communicatively coupled to the at least one interface.

13. The system of claim 10, wherein the at least one interface is selected from the group of interfaces consisting of: a Universal Serial Bus ("USB") interface; an IEEE 1394 ("Firewire") interface; a High Definition Multimedia Interface ("HDMI"); a Digital Video Interface ("DVI"); a Video Graphics Array ("VGA") interface; an Ethernet interface; and an External Serial Advanced Technology Attachment ("eSATA") interface.

\* \* \* \* \*

UNITED STATES PATENT AND TRADEMARK OFFICE
CERTIFICATE OF CORRECTION

| | |
|---|---|
| PATENT NO. | : 8,002,561 B1 |
| APPLICATION NO. | : 12/713048 |
| DATED | : August 23, 2011 |
| INVENTOR(S) | : Mark David Senatori |

It is certified that error appears in the above-identified patent and that said Letters Patent is hereby corrected as shown below:

In column 6, line 1, in Claim 1, delete "hollow" and insert -- hollow, flexible --, therefor.

In column 6, line 5, in Claim 1, delete "coupled" and insert -- coupled to --, therefor.

In column 7, line 2, in Claim 11, delete "dust-light" and insert -- dust-tight --, therefor.

Signed and Sealed this
Thirty-first Day of July, 2012

David J. Kappos
*Director of the United States Patent and Trademark Office*